United States Patent
Balardeta et al.

(10) Patent No.: US 6,741,108 B1
(45) Date of Patent: *May 25, 2004

(54) METHOD AND CIRCUIT TO REDUCE JITTER GENERATION IN A PLL USING A REFERENCE QUADRUPLER AND AN EQUALIZER

(75) Inventors: Joseph James Balardeta, Del Mar, CA (US); Allen Carl Merrill, Encinitas, CA (US); Wei Fu, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/132,462

(22) Filed: Apr. 25, 2002

(51) Int. Cl.[7] ................................................ H03L 7/06
(52) U.S. Cl. ...................... 327/156; 327/147; 375/376; 331/DIG. 2
(58) Field of Search ............................ 327/3, 7, 12, 16, 327/17, 40, 43, 47, 49, 99, 116, 119, 147, 150, 156, 159, 291, 293, 294, 407; 375/375, 376; 331/1 A, 11, 18, 25, DIG. 2

(56) References Cited

U.S. PATENT DOCUMENTS

| | | | | | |
|---|---|---|---|---|---|
| 5,227,671 | A | * | 7/1993 | Ehrlich | ........................ 327/108 |
| 5,241,285 | A | * | 8/1993 | Jackson | ........................ 331/1 A |
| 5,500,627 | A | * | 3/1996 | Hulsing, II | ................. 331/1 A |
| 5,566,204 | A | * | 10/1996 | Kardontchik et al. | ........ 375/219 |
| 5,963,071 | A | * | 10/1999 | Dowlatabadi | ............... 327/175 |
| 6,107,891 | A | * | 8/2000 | Coy | ............................ 331/18 |
| 6,198,317 | B1 | * | 3/2001 | Chow et al. | ................. 327/116 |
| 6,538,520 | B1 | * | 3/2003 | Merrill et al. | ................ 331/18 |

* cited by examiner

Primary Examiner—Timothy P. Callahan
Assistant Examiner—Hai L. Nguyen
(74) Attorney, Agent, or Firm—INCAPLAW; Terrance A. Meador

(57) ABSTRACT

A method of reducing jitter in a phase locked loop (PLL) includes receiving a first reference signal, quadrupling a frequency of the first reference signal to produce a second reference signal, and providing the second reference signal to a frequency phase detector of the PLL. The method may also include equalizing the second reference signal prior to providing the second reference signal to the frequency phase detector. The method can be accomplished by a circuit, wherein quadrupling the frequency of the first reference signal is performed by two frequency doublers arranged in series. The step of equalizing can be performed by two equalizers, each one configured to equalize an output of a respective frequency doubler.

15 Claims, 4 Drawing Sheets

METHOD AND CIRCUIT TO REDUCE JITTER GENERATION IN A PLL USING A REFERENCE QUADRUPLER AND AN EQUALIZER

BACKGROUND OF THE INVENTION

The present invention relates generally to reducing jitter in a phase locked loop (PLL), and more particularly to methods and apparatus for producing a reference frequency signal for a PLL using a reference frequency quadrupler.

A conventional phase locked loop (PLL) typically includes a frequency phase detector which receives a reference signal, a filter, a voltage-controlled oscillator (VCO), and a divider circuit. If the reference signal received by the frequency phase detector has a relatively low frequency, a large feedback divider ratio is required by the PLL. A large feedback divider ratio requires that the divider circuit have a relatively large number of dividers, which undesirably introduces phase "jitter" into the signals. The large feedback divider ratio also means that the loop gain of the PLL will be lower for a given supply voltage, which makes the gain distribution for noise less ideal and also increases jitter.

One solution to this problem is to increase the frequency of the reference signal received by the frequency phase detector. However, conventional XOR-based frequency doublers typically distort the duty cycle of reference signals due to integrated circuit (IC) process variations. This distortion may be severe enough to render the approach ineffective.

SUMMARY OF THE INVENTION

According to the present invention, a jitter reduction circuit for a phase locked loop (PLL) includes a first frequency doubler, a first equalizer having an input coupled to an output of the first frequency doubler, a second frequency doubler having an input coupled to an output of the first equalizer, a second equalizer having an input coupled to an output of the second frequency doubler, and a frequency phase detector having a first input coupled to an output of the second equalizer and a second input coupled to an output of a voltage controlled oscillator (VCO) of the PLL.

Each frequency doubler is configured to double a frequency of a reference signal provided thereto. The combination of the two frequency doublers in series quadruples the reference signal into the PLL. The first equalizer helps restore the duty cycle of the signal before it enters the second frequency doubler, and the second equalizer helps restore the duty cycle before the signal enters the PLL. The increased (quadrupled) reference frequency allows the PLL to have a smaller feedback divider ratio and therefore fewer dividers; fewer dividers result in less circuitry in the PLL feedback path which reduces jitter. A reduced divider ratio also allows a higher loop gain for a given supply voltage, which produces a more ideal gain distribution for noise and reduces jitter as well. Importantly as well, controls for the selection of the initial reference signal are advantageously provided.

The invention, embodied as a method, includes receiving a first reference signal, quadrupling a frequency of the first reference signal to produce a second reference signal, and equalizing the second reference signal to produce the PLL rat reference signal. The step of quadrupling a frequency of the first reference signal may include doubling a frequency of the first reference signal to produce an intermediate reference signal having a frequency that is twice that of the first reference signal. The step further may include doubling the frequency of the intermediate reference signal to produce a second reference signal having a frequency that is four times that of the first reference signal. The method further may include providing the second reference signal to the PLL.

DETAILED DESCRIPTION OF THE PREFERRED EMBODIMENTS

According to the present invention, circuitry for a phase locked loop (PLL) includes a frequency quadrupler and an equalizer. In one embodiment, the frequency quadrupler includes a first frequency doubler and a second frequency doubler. The equalizer preferably includes a first equalizer and a second equalizer.

In a preferred embodiment, the circuitry includes a first frequency doubler; a first equalizer having an input coupled to an output of the first frequency doubler; a second frequency doubler having an input coupled to an output of the first equalizer; and a second equalizer having an input coupled to an output of the second frequency doubler and an output which is fed into the PLL. Each one of the frequency doublers includes a delay circuit having an input coupled to the input of the frequency doubler, and an XOR circuit having a first input coupled to an output of the delay circuit and a second input coupled to the input of the frequency doubler. The combination of the two frequency doublers in series quadruples the reference signal into the PLL, which allows the PLL to have a smaller feedback divider ratio and a higher loop gain for reducing jitter. A reference signal input is configured to provide one or more reference signals, having a large range of frequencies. Advantageously, controls for the selection of the initial reference signal are provided.

Figure 1:
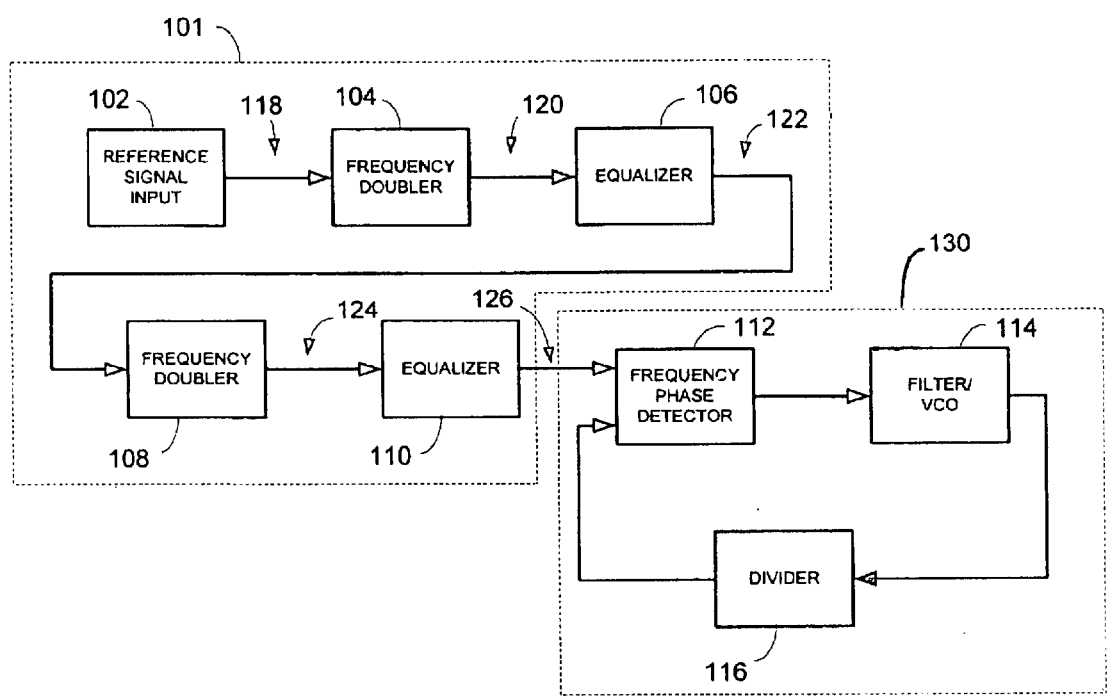
FIG. 1 is a schematic block diagram of the present invention for use with a phase locked loop (PLL)

FIG. 1 is a schematic block diagram of circuitry 100 which includes a jitter reduction circuit 101 for a reference signal to a PLL 130. Circuitry 100 may be embodied in an integrated circuit (IC) device. The jitter reduction circuit 101 includes a reference signal input 102, a frequency doubler 104, an equalizer 106, a frequency doubler 108, an equalizer 110, and a frequency phase detector 112. The frequency phase detector 112 is also a part of a phase locked loop (PLL), which further includes a filter/voltage controlled oscillator 114 and a divider 116. Reference signal input 102 may include conventional circuitry, such as a crystal oscillator.

In the preferred embodiment, an input of frequency doubler 104 is coupled to an output of reference signal generator 102, and an output of frequency doubler 104 is coupled to an input of equalizer 106. Similarly, an input of frequency doubler 108 is coupled to an output of equalizer 106, and an output of frequency doubler 108 is coupled to an input of equalizer 110. Equalizer 110 has an output which is fed into an input of PLL 130. Each one of frequency doublers 104 and 108 has the structure and functionality as shown and described in relation to FIGS. 2 and 3A–3C.

The PLL of FIG. 1 includes a frequency phase detector 112, a filter and voltage-controlled oscillator (VCO) 114, and a divider 116. Frequency phase detector 112 has a first input coupled to the output of equalizer 110 and an output coupled to an input of filter and VCO 114. Although shown as a single block, filter and VCO 114 can include a filter coupled in series with a VCO where an output of the filter is coupled to an input of the VCO. An output of filter and VCO 114 is coupled to an input of divider 116, which has an output coupled to a second input of frequency phase detector 112.

Figure 2:
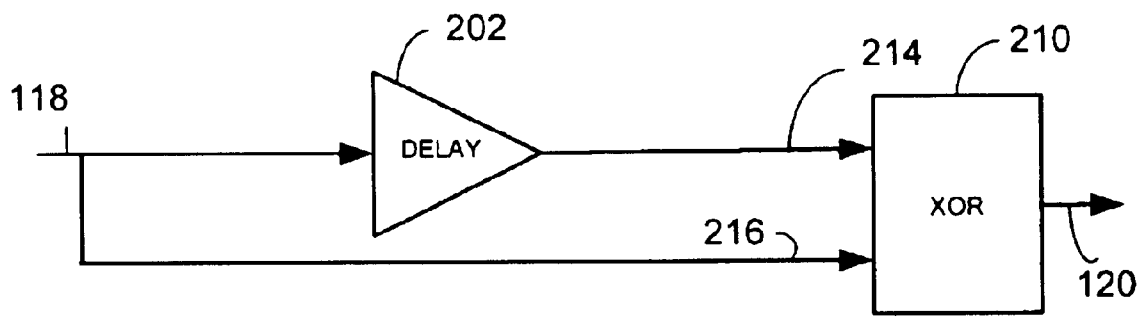
FIG. 2 is a schematic block diagram of a frequency doubler of FIG. 1.

Referring now to FIG. 2, a schematic block diagram of frequency doubler 104 of FIG. 1 is shown. The schematic block diagram of FIG. 2 may also apply to frequency doubler 108, but illustrates only frequency doubler 104 for simplicity. Frequency doubler 104 includes a delay circuit 202 and an XOR circuit 210. Delay circuit 202 is configured to provide a 90° delay for a particular frequency X. Delay circuit 202 has an input which is the input to frequency doubler 104, and an output coupled a first input 214 of XOR circuit 210. A second input 216 of XOR circuit 210 is coupled to the input of frequency doubler 104. The delayed signal on input 214 is XOR'd with the signal on input 216, to effectively double the frequency of an input signal on input 118, and produce the doubled frequency signal on output 120.

Figure 3A:
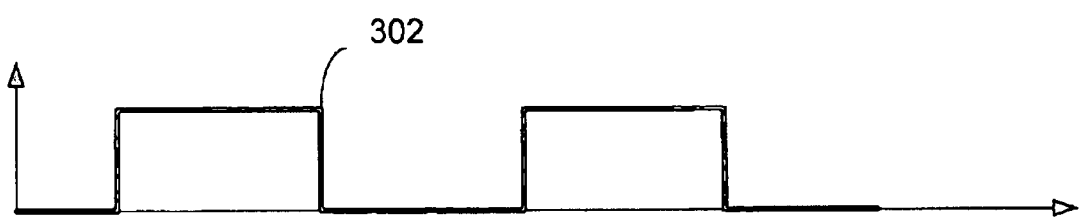
FIGS. 3A–3C are graphs of reference signals at various locations in the diagram of FIG. 2.
Figure 3B:
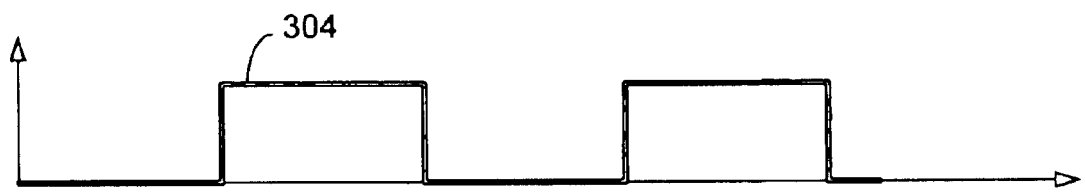
Figure 3C:
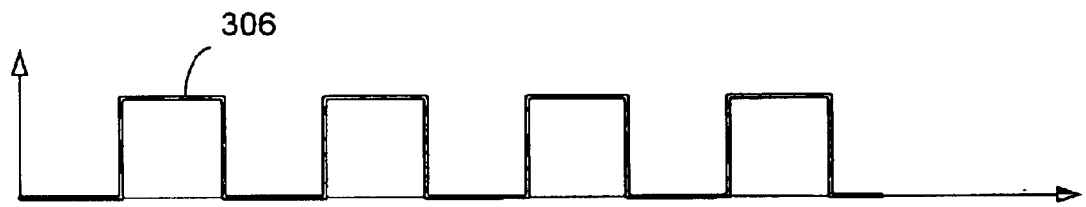

Referring to FIG. 3A, a signal 302 representing the first reference signal at lines 118 and 216 is shown. In FIG. 3B, a signal 304 representing the first out-of-phase signal at line 214 is shown. Since delay circuit 202 of FIG. 2 is configured as a 90° delay circuit for frequency X, signal 304 of FIG. 3B is 90° out-of-phase with signal 302 of FIG. 3A. In FIG. 3C, a resulting signal 306 at line 120 which is the XOR of the two aforementioned signals is shown. As illustrated, resulting signal 306 has a frequency 2*X.

Figure 4:
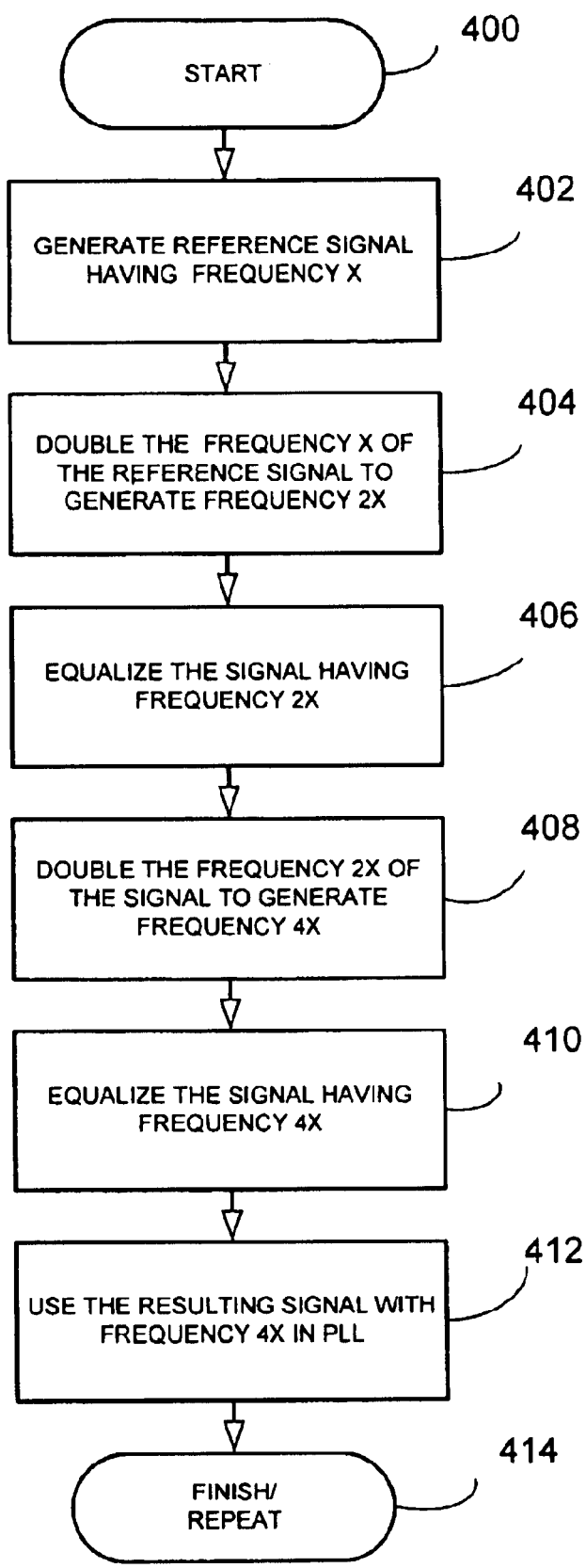
FIG. 4 is a flowchart describing a method of producing a reference frequency signal using the circuitry shown in FIG. 1.

FIG. 4 is a flowchart describing a method of producing a reference signal, which can be performed using circuitry 100 shown and described in relation to FIGS. 1, and 2. In the following description, FIGS. 1 and 4 will be referred to in combination. Beginning at a start block 400 of FIG. 4, a reference signal having a frequency X is generated by reference signal input 102 (step 402). Frequency X may be, for example, about 155 MHz. Next, the frequency X of the reference signal is doubled by frequency doubler 104 to produce a signal having a frequency 2*X (step 404). Frequency 2*X may be, for example, about 210 MHz. This signal is equalized by equalizer 106 (step 406).

Steps 404 (frequency doubling) and 406 (equalizing) are basically repeated in steps 408 and 410. More particularly, the equalized signal having frequency 2*X is doubled by frequency doubler 108 to produce a signal having a frequency 4*X (step 408). Frequency 4*X may be, for example, about 622 MHz. This resulting signal is then equalized by equalizer 110 (step 410). Finally, the equalized signal having frequency 4*X is used in PLL 130 (step 412). The flowchart ends at a finish block 414, but the method repeats continuously for a continuously applied reference signal from reference signal generator 102.

Several advantages are conferred with use of the present invention. Conventional XOR-based frequency doublers typically distort the duty cycle of the signal waveform over the process corners of IC fabrication. In the present invention, however, the first equalizer helps restore the duty cycle of the signal before it enters the second frequency doubler, and the second equalizer helps restore the duty cycle before the signal enters the frequency phase detector of the PLL. This increased (quadrupled) reference frequency at the input of the frequency phase detector allows the PLL to have a smaller feedback divider ratio and therefore fewer dividers; fewer dividers result in less circuitry in the PLL feedback path and reduces jitter. A reduced divider ratio also allows a higher loop gain for a given supply voltage, which produces a more ideal gain distribution for noise and reduces jitter as well.

Thus, a novel reference jitter reduction circuit suitable for use with a PLL has been described herein. The jitter reduction circuit may include a first frequency doubler; a first equalizer having an input coupled to an output of the first frequency doubler; a second frequency doubler having an input coupled to an output of the first equalizer; a second equalizer having an input coupled to an output of the second frequency doubler; and an output of the second equalizer for coupling to an input of the PLL. The PLL may include a frequency phase detector having a first input coupled to the output of the second equalizer; a filter having an input coupled to an output of the frequency phase detector; a voltage-controlled oscillator (VCO) having an input coupled to an output of the filter; and a divider having an input coupled to an output of the VCO and an output coupled to a second input of the frequency phase detector.

In addition, an inventive method described herein includes receiving a first reference signal having a frequency X; doubling the frequency X of the first reference signal to produce an intermediate reference signal having a frequency 2*X; equalizing the intermediate reference signal to produce an equalized intermediate reference signal; doubling the frequency 2*X of the equalized intermediate reference signal to produce a second reference signal having a frequency 4*X; and equalizing the second reference signal to produce an equalized second reference signal, having a frequency that is approximately four times that of the original, or first, reference signal for use in a PLL.

It is to be understood that the above is merely a description of preferred embodiments of the invention and that various changes, alterations, and variations may be made without departing from the true spirit and scope of the invention as set for in the appended claims. None of the terms or phrases in the specification and claims has been given any special particular meaning different from the plain language meaning to those skilled in the art, and therefore the specification is not to be used to define terms in an unduly narrow sense.

What is claimed is:

1. A method of producing a phase-locked loop (PLL) reference signal, the method comprising:

receiving a first reference signal;

quadrupling a frequency of the first reference signal to produce a second reference signal; and equalizing the second reference signal to produce the PLL reference signal.

2. The method of claim 1, wherein quadrupling the frequency of the first reference signal further comprises:

doubling the frequency of the first reference signal to produce an intermediate reference signal; and doubling the frequency of the intermediate reference signal to produce the second reference signal.

3. The method of claim 2, wherein equalizing the second reference signal includes reducing duty cycle distortion caused by quadrupling the frequency of the first reference signal.

4. The method of claim 2, wherein doubling the frequency of the first reference signal comprises:
  delaying the first reference signal to produce a first out-of-phase signal; and
  XORing the first reference signal and the first out-of-phase signal to produce the intermediate reference signal.

5. The method of claim 4, wherein doubling the frequency of the intermediate reference signal comprises:
  delaying the intermediate reference signal to produce a second out-of-phase signal; and
  XORing the intermediate reference signal and the second out-of-phase signal to produce the second reference signal having a frequency that is four times the frequency of the first reference signal.

6. The method of claim 5, wherein the combined delaying steps include delaying a phase of a signal by 90°.

7. A phase-locked loop (PLL) jitter reduction circuit, comprising:
  a first frequency doubler;
  a first equalizer having an input coupled to an output of the first frequency doubler;
  a second frequency doubler having an input coupled to an output of the first equalizer;
  a second equalizer having an input coupled to an output of the second frequency doubler; and
  a frequency phase detector having a first input coupled to an output of the second equalizer and a second input coupled to an output of a voltage controlled oscillator (VCO) of the PLL.

8. The circuit of claim 7, wherein each one of the first and the second frequency doublers further comprises:
  a delay circuit coupled to an input of the frequency doubler;
  an XOR circuit having a first input coupled to an output of the delay circuit and a second input coupled to the input of the frequency doubler; and
  an output of the first XOR circuit comprising the output of the frequency doubler.

9. The circuit of claim 8, wherein the delay circuit is configured to provide a 90° phase delay.

10. The circuit of claim 7, wherein the first and the second equalizers are duty cycle equalizers.

11. An integrated circuit (IC), comprising:
  a reference frequency quadrupler, including:
    a first frequency doubler configured to double a frequency of a first reference signal to produce an intermediate reference signal;
    a second frequency doubler configured to double a frequency of the intermediate reference signal to produce a second reference signal; and
    an equalizer configured to restore duty cycle errors caused by the first and second frequency doublers; and
  a phase locked loop (PLL), including:
    a frequency phase detector having a first input coupled to an output of the reference signal quadrupler;
    a filter having an input coupled to an output of the frequency phase detector;
    a voltage-controlled oscillator (VCO) having an input coupled to an output of the filter;
    a divider having an input coupled to an output of the VCO and an output coupled to a second input of the frequency phase detector.

12. The IC of claim 11, wherein the equalizer further comprises:
  a first equalizer having an input coupled to an output of the first frequency doubler, and an output coupled to an input of the second frequency doubler; and
  a second equalizer having an input coupled to an output of the second frequency doubler, and an output coupled to the first input of the frequency phase detector.

13. The IC of claim 11, wherein each one of the first and the second frequency doublers further comprises:
  a delay circuit coupled to an input of the frequency doubler;
  an XOR circuit having a first input coupled to an output of the delay circuit and a second input coupled to the input of the frequency doubler; and
  an output of the first XOR circuit comprising the output of the frequency doubler.

14. The circuit of claim 12, wherein the first and the second equalizers are duty cycle equalizers.

15. The IC of claim 13, wherein each delay circuit is configured to provide an 90° phase shift.

* * * * *

UNITED STATES PATENT AND TRADEMARK OFFICE
CERTIFICATE OF CORRECTION

PATENT NO. : 6,741,108 B1  Page 1 of 1
APPLICATION NO. : 10/132462
DATED : May 25, 2004
INVENTOR(S) : Balardeta et al.

It is certified that error appears in the above-identified patent and that said Letters Patent is hereby corrected as shown below:

IN THE CLAIMS

Column 6, Claim 14, delete "circuit" and insert --IC--

Signed and Sealed this

Sixteenth Day of September, 2008

JON W. DUDAS
*Director of the United States Patent and Trademark Office*